United States Patent
Hudyma et al.

(10) Patent No.: US 6,906,866 B2
(45) Date of Patent: Jun. 14, 2005

(54) COMPACT 1½-WAIST SYSTEM FOR SUB 100 NM ARF LITHOGRAPHY

(75) Inventors: Russell Hudyma, San Ramon, CA (US); Wilhelm Ulrich, Aalen (DE); Hans-Juergen Rostalski, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/688,212

(22) Filed: Oct. 15, 2003

(65) Prior Publication Data

US 2005/0083583 A1 Apr. 21, 2005

(51) Int. Cl.$^7$ .............................. G02B 3/00; G02B 9/00
(52) U.S. Cl. ...................... 359/649; 359/650; 359/761; 359/781
(58) Field of Search ................................ 359/649, 650, 359/651, 754, 755, 756, 761, 781

(56) References Cited

U.S. PATENT DOCUMENTS

| | | | |
|---|---|---|---|
| 6,008,884 A | 12/1999 | Yamaguchi et al. | 359/649 |
| 6,259,508 B1 | 7/2001 | Shigematsu | 355/67 |
| 6,560,031 B1 | 5/2003 | Shafer et al. | 359/649 |
| 6,590,715 B2 | 7/2003 | Shafer et al. | 355/54 |
| 6,606,144 B1 * | 8/2003 | Omura | 355/67 |
| 6,710,930 B2 * | 3/2004 | Suzuki et al. | 359/649 |
| 2003/0048547 A1 * | 3/2003 | Schuster | 359/781 |
| 2003/0086183 A1 * | 5/2003 | Wagner et al. | 359/754 |
| 2003/0137745 A1 * | 7/2003 | Takahashi | 359/649 |

FOREIGN PATENT DOCUMENTS

| | | |
|---|---|---|
| EP | 1061396 A2 | 12/2000 |
| EP | 1139138 A1 | 10/2001 |

* cited by examiner

*Primary Examiner*—Ricky Mack
*Assistant Examiner*—Brandi Thomas
(74) *Attorney, Agent, or Firm*—Darby & Darby

(57) ABSTRACT

According to one exemplary embodiment, a projection lens having an object plane and an image plane is provided and includes the following lens groups listed objectwise to imagewise: (1) a first lens group having negative refractive power; and (2) at least three other lens groups having a positive refractive power and at least one other lens group having a negative refractive power. In one embodiment, the projections lens includes a second lens group having a positive refractive power; a third lens group having a negative refractive power; and fourth, fifth and sixth lens groups having overall positive refractive power. The projection lens having a numerical aperture of at least about 0.85 and is of a 1½ waist construction, with the ½ waist defined in the first lens group and a primary waist is defined in the third lens group.

31 Claims, 9 Drawing Sheets

| Field (mm) | Distortion (nm) |
|---|---|
| 0.000000 | 0.000 |
| 0.701000 | 0.000 |
| 1.402000 | -0.005 |
| 2.103000 | -0.019 |
| 2.804000 | -0.049 |
| 3.505000 | -0.095 |
| 4.206000 | -0.142 |
| 4.907000 | -0.157 |
| 5.608000 | -0.107 |
| 6.309000 | 0.018 |
| 7.010000 | 0.189 |
| 7.711000 | 0.334 |
| 8.412000 | 0.385 |
| 9.113000 | 0.333 |
| 9.814000 | 0.269 |
| 10.515000 | 0.325 |
| 11.216000 | 0.497 |
| 11.917000 | 0.505 |
| 12.618000 | 0.040 |
| 13.319000 | -0.349 |
| 14.020000 | 0.476 |

| NA | Shift (mm) |
|---|---|
| 0.500 | -25.946 |
| 0.525 | -25.071 |
| 0.550 | -24.042 |
| 0.575 | -22.930 |
| 0.600 | -21.730 |
| 0.625 | -20.435 |
| 0.650 | -18.901 |
| 0.675 | -17.345 |
| 0.700 | -15.654 |
| 0.725 | -13.806 |
| 0.750 | -11.633 |
| 0.775 | -9.328 |
| 0.800 | -6.619 |
| 0.825 | -3.627 |
| 0.850 | 0.000 | ns
COMPACT 1½-WAIST SYSTEM FOR SUB 100 NM ARF LITHOGRAPHY

TECHNICAL FIELD

The present invention relates to an optic system, such as projection lithography and more particularly, relates to a 1½ waist optic system for ArF lithography.

BACKGROUND

In the manufacture of semiconductor devices, photolithography is often used, especially in view of the circuit patterns of semiconductors being increasingly miniaturized in recent years. Projection optics are used to image a mask or reticle onto a wafer and as circuit patterns have become increasingly smaller, there is an increased demand for higher resolving power in exposure apparatuses that print these patterns. To satisfy this demand, the wavelength of the light source must be made shorter and the NA (numerical aperture) of the optical system (i.e., the projection lens) must be made larger.

One way to describe an optic system is by the location and/or number of waists that are formed throughout the system. For example, a 1½ waist system is characterized by using two negative lens groups in minimum. Each of them comprises a minimal two negative lenses. The first of these groups with negative power is located at the beginning of the lens system. The overall length of this group is smaller then 15% of the overall length of the complete lens system. Furthermore this lens group has a positive lens as the first lens element. The usual used term 'waist' characterizes the shape of the light beam running through the system. At a waist the beam presents a local minimum in the diameter of the beam. It is characterized by the upper coma ray that changes its direction from convergent to divergent inside a negative lens group. The minimum beam diameter at a waist is smaller then about 90% of the maximum beam diameter before and after the waist. This means the maximum beam diameters before and after that waist are larger then about 110% of the minimum beam diameter at the waist. In view of this, a half waist is understood as a more shallow change of the beam diameter. At a half waist, the change of direction of the upper coma ray is remarkable smaller than in a regular waist. The minimum beam diameter inside the waist is only smaller then about 95% of the beam diameter after the waist. The maximum beam diameter is increasing only after the waist to values that are larger then about 105% of the minimum beam diameter at the half waist. The foregoing discussion defines the term "1½ waist" as used throughout the present specification.

The prior art does include some examples of dioptric projection systems for DUV lithography that have both a large numerical aperture and a large field (e.g. 26 mm×8 mm or larger) suitable to support step and scan lithography. For example, U.S. Pat. Nos. 6,008,884 and 6,259,508; European patent application EP 1061396A2 and European patent application EP 1139138A1 disclose dioptric projection systems. Each of these documents is incorporated herein by reference in its entirety. The '884 and the '508 patents disclose that no aspheres be used in or after the primary waist, with the exception of aspheres located in close proximity to the wafer. In addition, these patents disclose that no aspheres are present in the positive lens group that follows the principle waist. FIG. 1 is a schematic illustration of one exemplary dioptric projection system 10 that is disclosed in the '508 patent. The '396 patent application places limitations of asphere behavior, specifically excluding aspheric surface pairs whose "local curvature powers change with mutually opposite signs." The '138 application discloses and describes various shapes that can be used for the asphere in such a system (e.g., no aspheres on concave surfaces). More specifically, the '138 application discloses that the local principal curvatures Ca and Cb are computed as follows:

$$C_a = \frac{1}{r}$$

$$C_b = \frac{\frac{d^2 z}{d^2 y}}{\left[1 + \left(\frac{dz}{dy}\right)^2\right]^{2/3}}$$

In equations (1) Ca is the local curvature at the vertex of the asphere and Cb is the local curvature in the tangential or meridional plane at an extreme region of the clear aperture, r is the vertex radius and the first and second derivative of z are taken from standard aspheric sag equation. The '138 application lists limitations for the system that are based on a ratio of Cb/Ca for both positive and negative surfaces in the region closest to the mask.

In addition, U.S. Pat. Nos. 6,560,031 and 6,590,715 disclose optical projection lens systems that include one or more waists in each system. The '031 and '715 patents are assigned to the present assignee and offer alternative design constructions; however, none of these systems discloses the present system and provides the associated advantages and benefits disclosed herein.

What has heretofore not been available is a compact 1½ waist projection system having reduced axial chromatic aberration and offering an alternative construction relative to the above mentioned known systems.

SUMMARY

According to one exemplary embodiment, a projection lens having an object plane and an image plane is provided and includes the following lens groups listed objectwise to imagewise: (1) a first lens group having negative refractive power; and (2) at least three other lens groups having a positive refractive power and at least one other lens group having a negative refractive power. In one embodiment, the projections lens includes a second lens group having a positive refractive power; a third lens group having a negative refractive power; and fourth, fifth and sixth lens groups having overall positive refractive power. The projection lens having a numerical aperture of at least about 0.85 and is of a 1½ waist construction, with the ½ waist defined in the first lens group and a primary waist is defined in the third lens group.

Moreover, the projection lens satisfies one or more of the following design conditions: (1) the first six most object forward lens elements are free of aspheric convex surfaces; (2) wherein a Ca/Cb ratio of less than 1.60 is maintained on convex aspheric surfaces that are associated with either one of the two most object forward lens elements of the system; (3) wherein a Ca/Cb ratio of less than 2.35 is maintained on convex aspheric surfaces that are associated with either the third or fourth most object forward lens elements; (4) wherein at least one of the two most object forward lens elements has a concave aspheric surface and a Ca/Cb ratio is maintained at greater than or equal to about 0.70; (5) wherein a third or fourth most object forward lens elements has a concave aspheric surface and a Ca/Cb ratio is maintained at greater than or equal to about 0.45.

Contrary to the teachings of the prior art, applicants have discovered that a compact 1½ waist projection system with reduced axial chromatic aberration can be provided with a design where (1) the most object forward lens group is negative; (2) negative power is shifted from the principle waist at G3 to the secondary (½) waist at lens group G1; and (3) a complete removal of aspheres from the aft section of the projection lens group, especially in lens groups G4 and G5.

Further aspects and features of the exemplary apparatus disclosed herein can be appreciated from the appended Figures and accompanying written description.

BRIEF DESCRIPTION OF THE DRAWING FIGURES

The foregoing and other features of the present invention will be more readily apparent from the following detailed description and drawing figures of illustrative embodiments of the invention in which:

FIG. 1 schematically illustrates a conventional dioptric projection lens system;

FIG. 2 schematically illustrates an exemplary ½ waist dioptric projection lens system according to a first embodiment;

Figure 2:
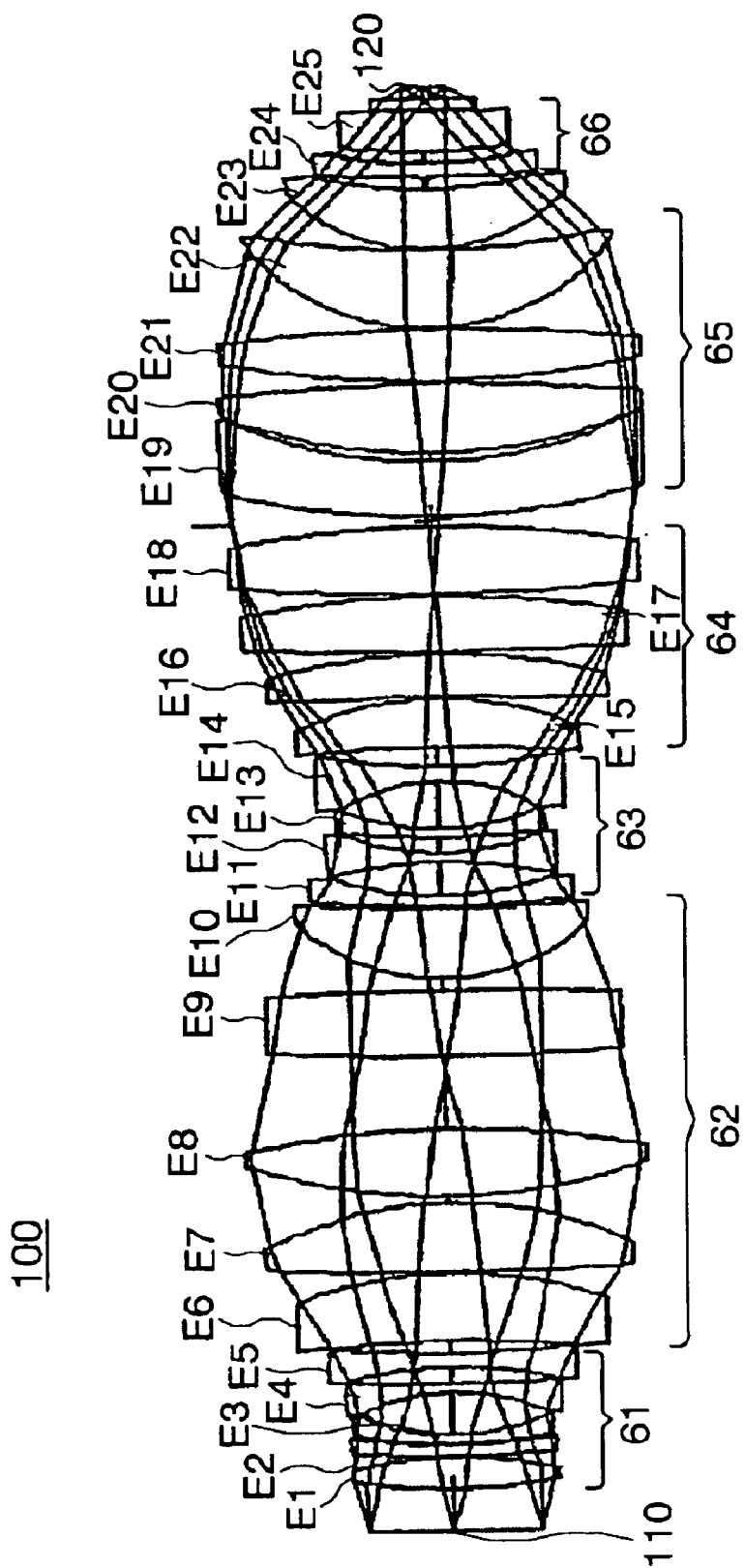
Figure 7:
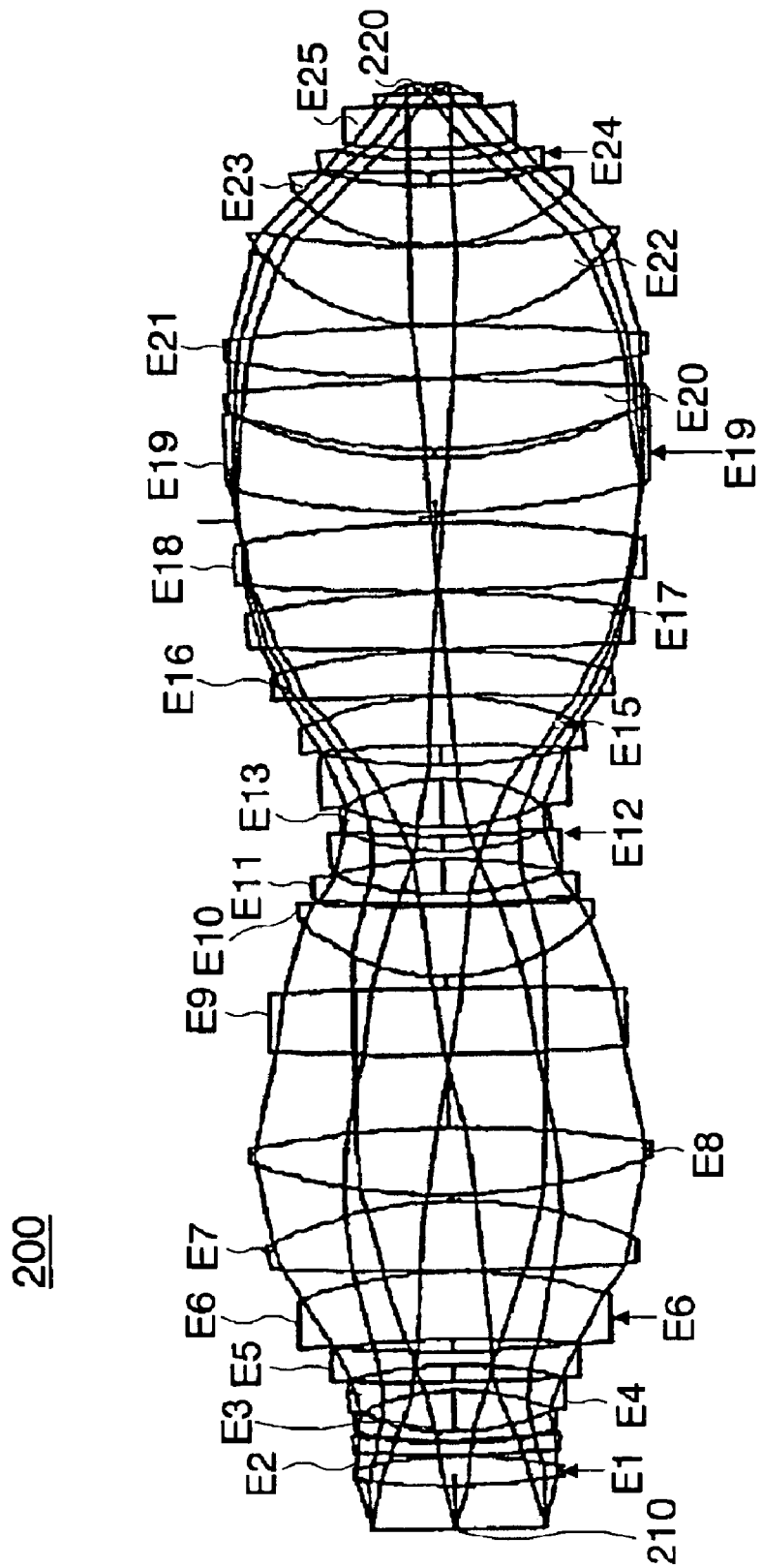
Figure 8:
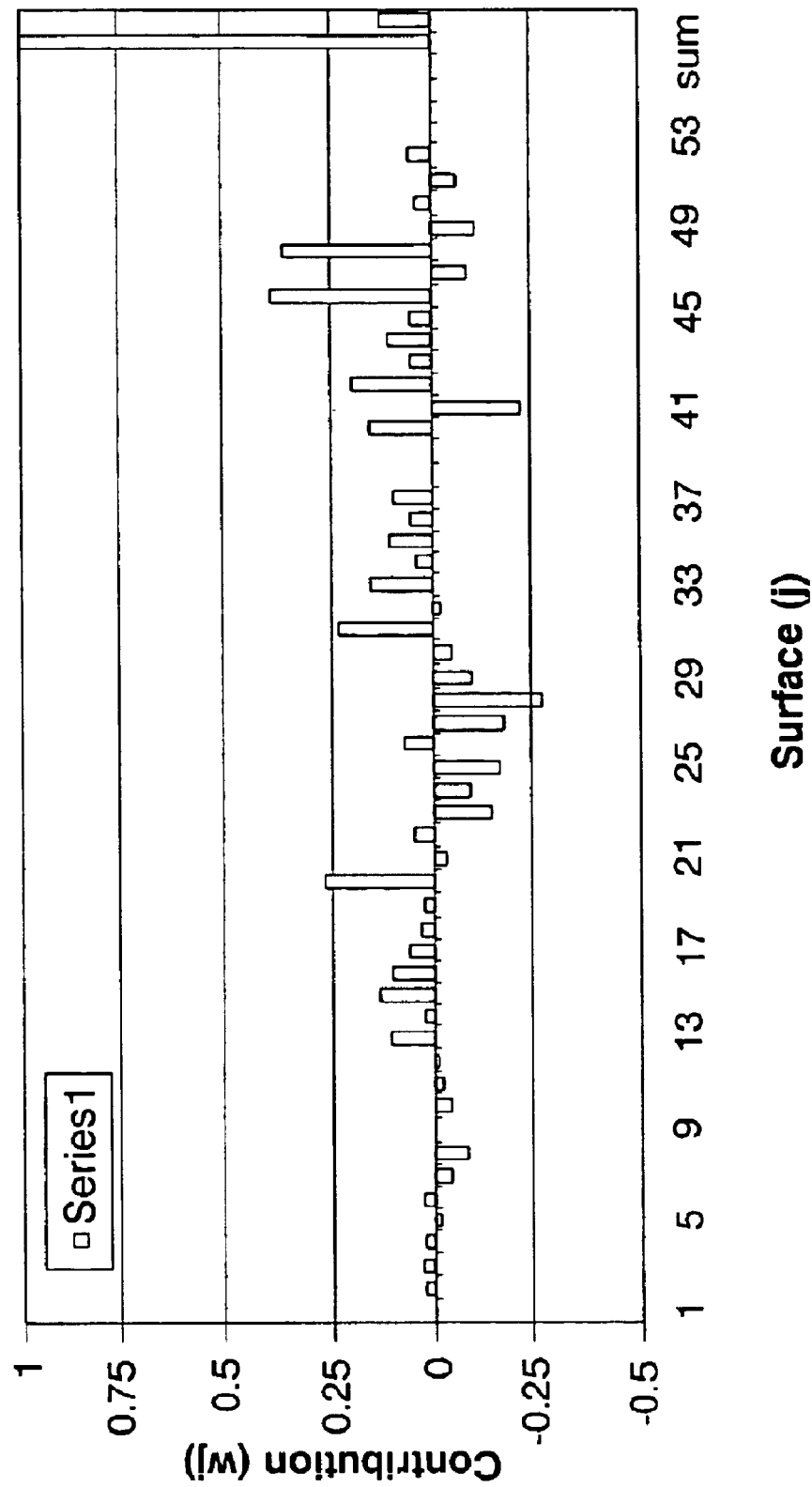
Figure 9:
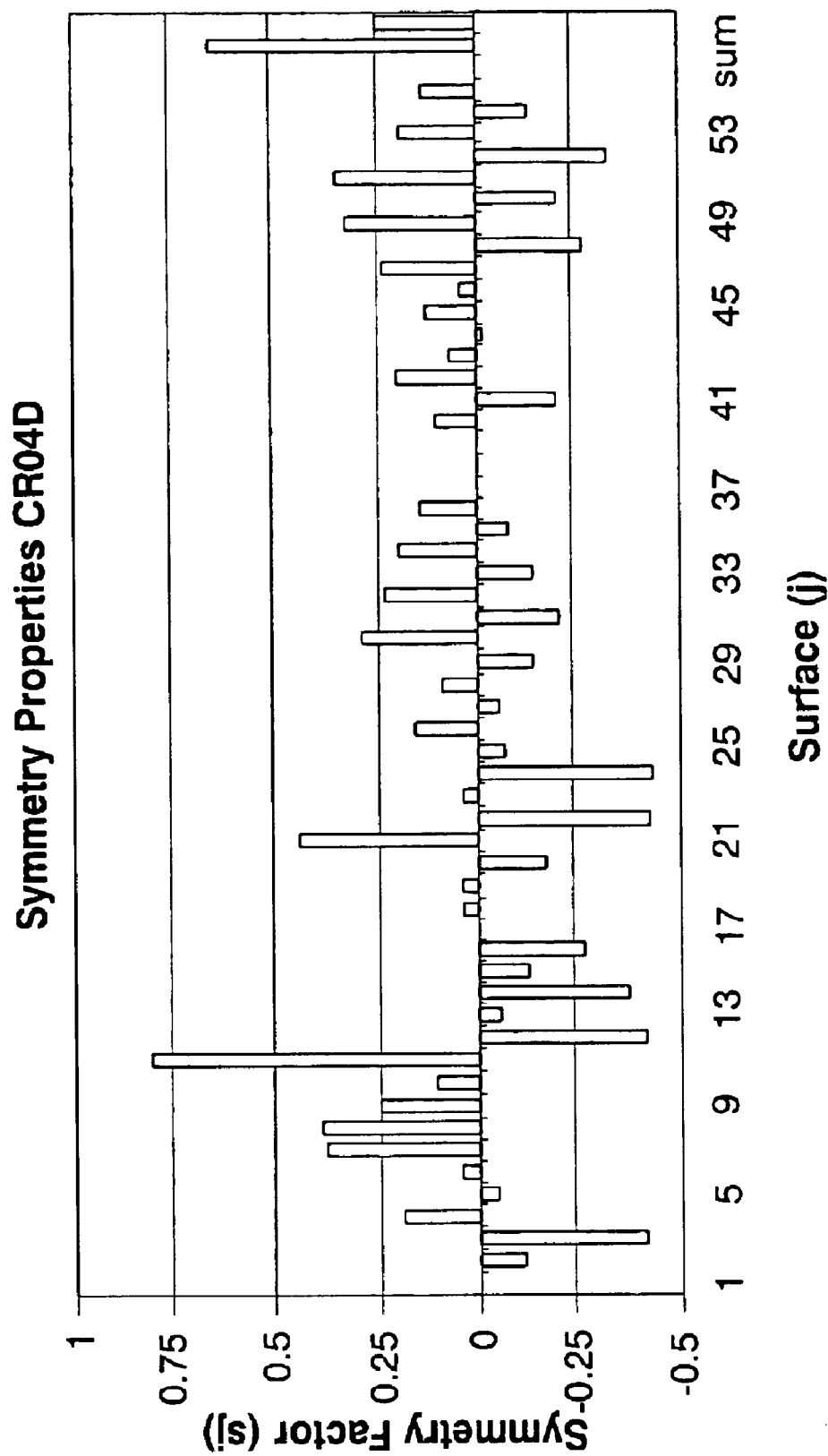

FIG. 7 schematically illustrates another exemplary 1½ waist dioptric projection lens system according to a second embodiment;

FIG. 8 shows the distribution of optical power in the system of FIG. 2 illustrating 1½ waist structure with W=0.12; and FIG. 9 shows the symmetric properties of the system of FIG. 2.

DETAILED DESCRIPTION OF PREFERRED EMBODIMENTS

As previously mentioned in the background, the patent literature teaches exclusively that a dioptric projection lens for DUV lithography requires aspheric surfaces located at the primary waist in group G3 of the lens elements. The literature also suggests that aspheres are required at the fast conjugate in group G4 and/or group G5 to achieve control of pupil dependent aberrations (spherical and coma). The patent literature also teaches that group G1 should be positive and that the design must be "relaxed" to achieve lithographic metrices with a total track that is on the order of approximately 1200 mm with element diameters approaching 300 mm in group G5 at a numerical aperture (NA) of 0.85.

Applicants have discovered that significant advantages can be realized by making three changes that are completely contrary to the teachings of the patent literature. More specifically, the following features are embodied in the present lens systems: (1) the addition of a negative lens group G1; (2) a shift of negative power from the principle waist at G3 to the secondary or ½ waist at group G1; and (3) a complete removal of aspheres from the aft section of the projection lens, especially in lens group G4 and G5.

One exemplary embodiment that embodies these features is illustrated in FIG. 2. In FIG. 2, a dioptric projection lens system 100 is provided and includes 25 optical elements and 6 aspheres that are arranged in manner that is contrary to the teachings of the patent literature. The lens system 100 includes a plurality of lens groups, namely lens groups G1; G2; G3; G4; G5 and G6 and includes more positive lens elements than negative lens elements. More specifically, in the illustrated embodiment, 15 of the 25 lens elements are positive, while 10 lens elements are negative.

The system 100 includes a reticle (object) 110 and a wafer 120 on which a reduced image is formed based on the reticle 110 as is commonly known. Beginning from the least image forward element and ending with the most image forward element along the optical path of the system 100, the system 100 has a first lens group G1 that includes a first lens element E1 (a positive lens); a second lens element E2 (a negative lens); a third lens element E3 (a negative lens); a fourth lens element E4 (a negative lens); and a fifth lens element E5 (a negative lens). The overall power of the lens group G1 is negative which is contrary to the teachings of the patent literature which discloses that a positive lens group G1 provides advantages. As will be described hereinafter, the lens group G1 has lens elements arranged so that a ½ waist is formed in this group.

The system 100 has a second lens group G2 that includes a sixth lens element E6 (a positive lens); a seventh lens element E7 (a positive lens); an eighth lens element E8 (a positive lens); a ninth lens element E9 (a positive lens); and a tenth lens element E10 (a positive lens). The overall power of the second lens group G2 is positive due to it being formed entirely of positive lenses.

A third lens group G3 is provided in the system 100 and it is in this lens group that the primary waist of the system 100 is formed. The third lens group G3 includes an eleventh lens element E11 (a negative lens); a twelfth lens element E12 (a negative lens); a thirteenth lens element E13 (a negative lens); and a fourteenth lens element E14 (a negative lens). The overall power of the third lens group G3 is negative due to it being formed entirely of negative lenses in the illustrated embodiment.

The lens system 100 includes a fourth lens group G4 which is comprised of a number of strong positive lenses. For example, the illustrated lens group G4 is formed of a fifteenth lens element E15 (a positive lens); a sixteenth lens element E16 (a positive lens); a seventeenth lens element E17 (a positive lens); and an eighteenth lens element E18 (a positive lens).

A fifth lens group G5 is provided and includes a nineteenth lens element E19 (a negative lens); a twentieth lens element E20 (a positive lens); a twenty first lens element E21 (a positive lens); a twenty second lens element E22 (a positive lens); and a twenty third lens element E23 (a positive lens).

The most image forward lens group in the system 100 is a sixth lens group G6. The sixth lens group G6 is formed of a twenty fourth lens element E24 (a negative lens) and a twenty fifth lens element E25 (a positive lens) that is disposed adjacent the wafer 120.

While the patent literature suggests that aspheres are most effectively used in lens groups G3, G4 and G5, the present lens system 100 is constructed in a completely opposite manner. The present asphere placement helps to enable a reduction in total track and element diameter, particularly in lens group G5. The present lens system 100 has a numerical aperture (NA) of about 0.85 and its construction enables a blank mass of about 94 kg and a low CHL of equal to about 400 nm/pm.

Figure 1:
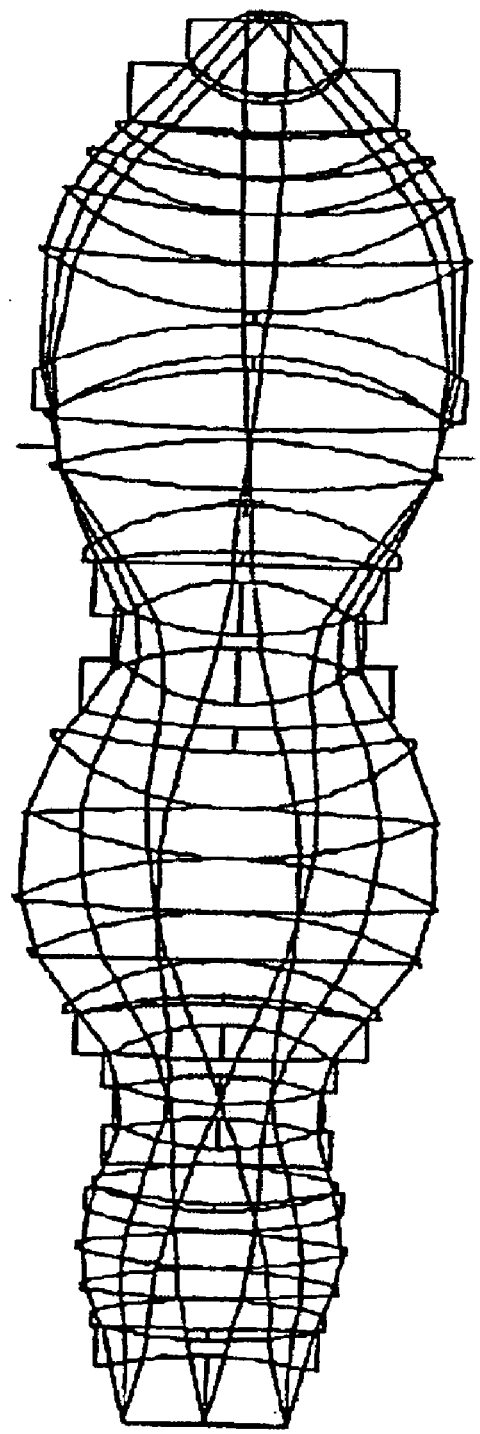

A comparison of the conventional lens system 10 illustrated in FIG. 1 and the present lens system 100 of FIG. 2 can be seen comparing the performance results and design characteristics of each system. For example, the conventional system 10 has the following properties (1) a numerical aperture of about 0.85; (2) a field of 28.04 mm; (3) a blank mass of 130 kg; (4) a total track of about 1200 mm and (5) a CHL of about 450 nm/pm. The present system 100 has the following properties: (1) a numerical aperture of about 0.85; (2) a field of about 28.04 mm; (3) a blank mass of about 94 kg; (4) a total track of 1100 mm; and (5) a CHL of about 400 nm/pm.

One basic advantage of the present 1½ waist system 100 is the compact nature of the system which leads to a low blank mass and a substantial reduction in residual axial chromatic aberration. This improvement is achieved by shifting power from the waist at lens group G3 into the lens group G1 using the aspheres to correct the higher-order aberrations that are induced by this power shift. By lowering the optical power at lens group G3, a strong positive lens group G4 effectively reduces the diameter of the large bulge of lens group G5. Since the chromatic contribution is proportional to $(y_a)^2$, this technique has powerful leverage to reduce axial color. A side benefit of this reduced chromatic residual is a meaningful reduction in blank mass. The asphere in the lens group G6 provides a good measure of higher order astigmatism correction, thereby enabling the residual composite RMS wavefront error to be reduced from 6 milliwaves to less than 4 milliwaves. The embodiment of FIG. 2 makes effective use of optical power (W=0.12) and uses a moderately high design of symmetry (S=0.25), demonstrated qualitatively by the smooth ray bending throughout the design.

As will be appreciated by a comparison of the characteristics of the conventional lens system 10 (FIG. 1) and the present system 100 of FIG. 2, the present system 100 achieves a blank mass that is some 35 kg less than similar systems that define the state of the art. In addition, the present design reduces the residual axial chromatic aberration by 12.5% and enables a track length of 1100 mm.

The basic performance of the present system 100 of FIG. 2 is summarized in Table 1 below.

TABLE 1

Performance Summary of System 100 of FIG. 2.

| Metric | Performance |
| --- | --- |
| Configuration | 25 lens elements, 6 aspheres |
| Wavelength | 193.304 nm |
| Numerical aperture (wafer) | 0.85 |
| Field (wafer) | 28.04 |
| Reduction ratio (nominal) | 4:1 |
| Total track length (mm) | 1100.0 |
| Blank Mass | 94.15 kg |
| Forward working distance | 32.0 mm |
| Back working distance | 8.0 mm |
| Telecentricity error | 0 mrad (mask)/0.4 mrad (wafer) |
| Composite RMS wavefront error | 0.0029λ (1) |
| Chief ray distortion | <1.0 nm (2) |
| Axial chromatic aberration (CHL) | 400 nm/pm |

TABLE 1-continued

Performance Summary of System 100 of FIG. 2.

| Metric | Performance |
| --- | --- |
| Lateral chromatic aberration (CVL) | 19 nm/pm |
| Zernike polynominal values | (3) |
| NA-stop characteristics | (4) |

Figure 3:
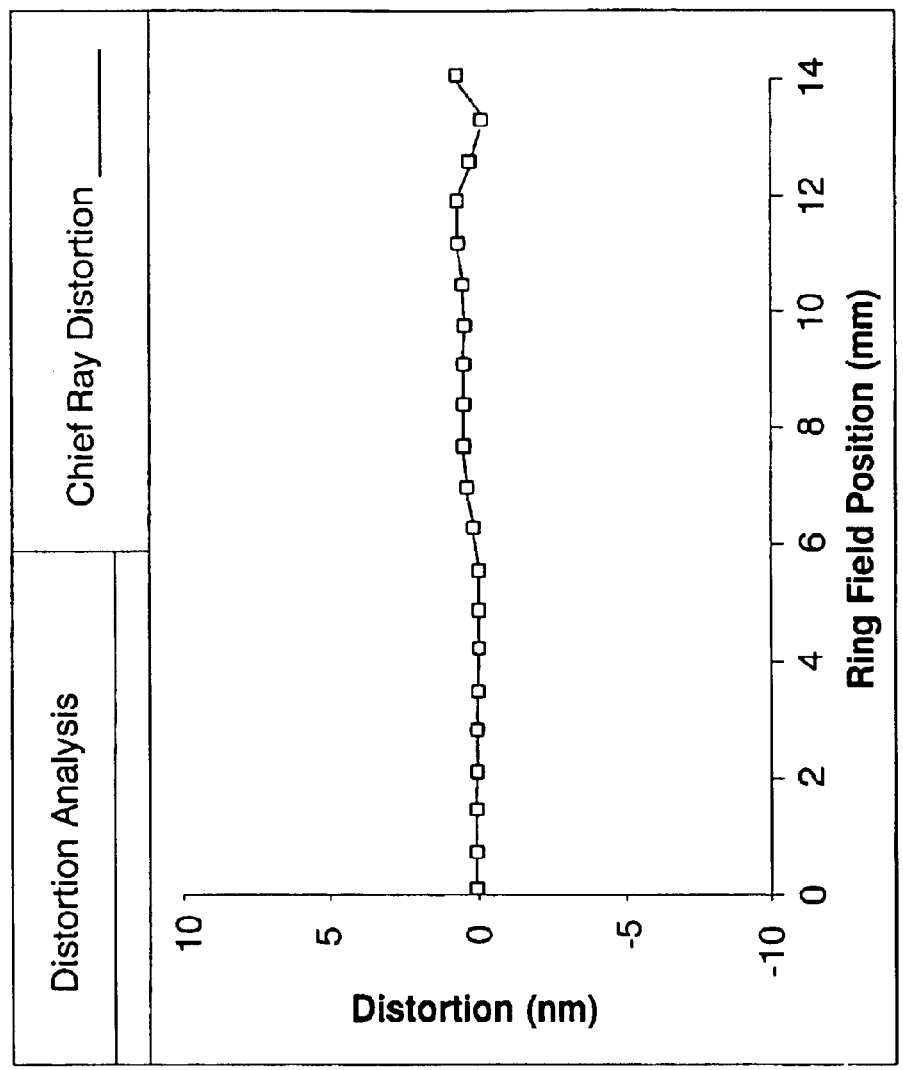
FIG. 3 is a representation of the chief ray distortion versus field of view for the system of FIG. 1.
Figure 4:
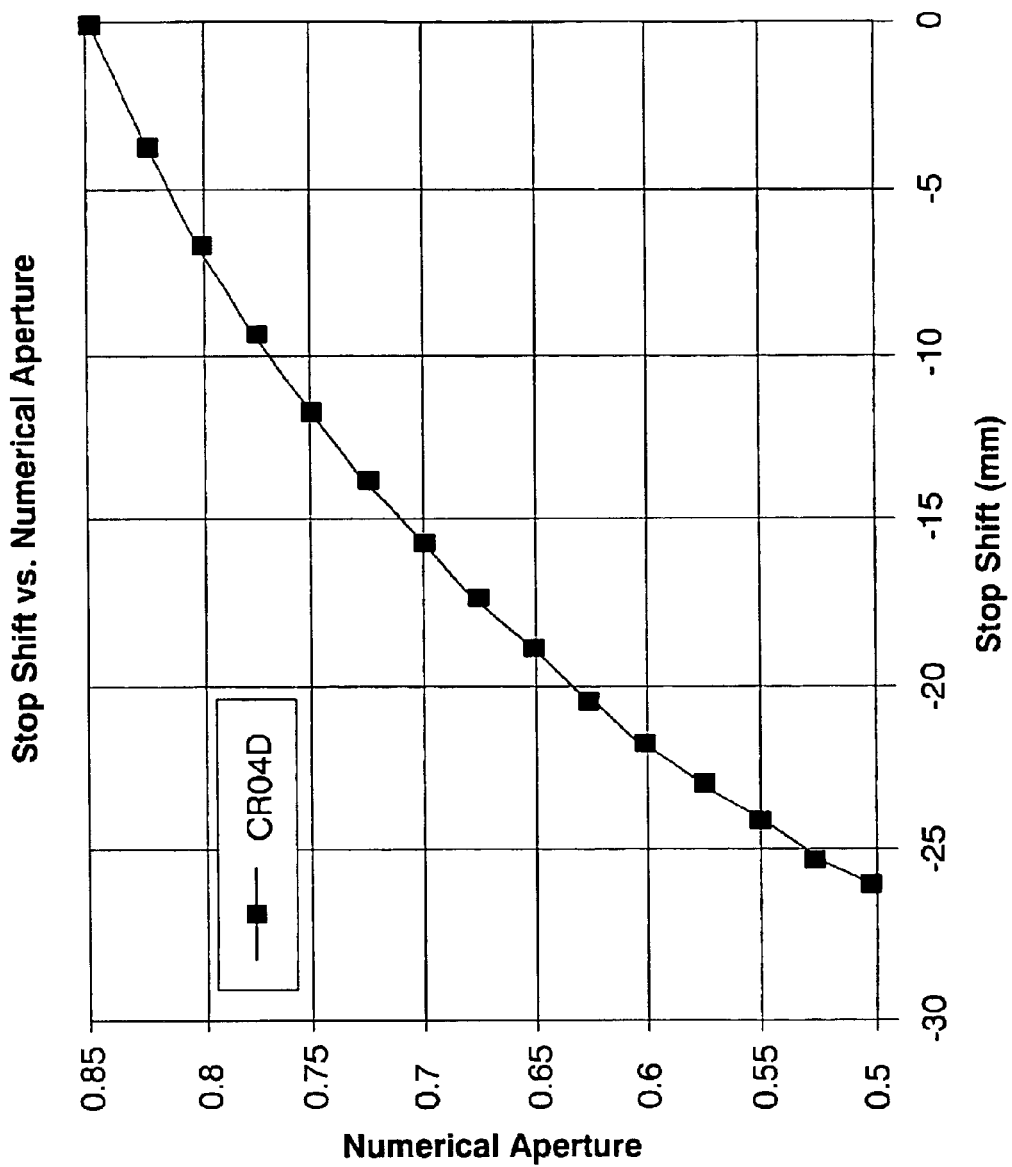
FIG. 4 is a representation of a variation in stop position versus numerical aperture.

[1]Table 2 provides detailed RMS values
[2]FIG. 3 provides detailed distortion values
[3]Table 3 lists Zernike coefficients
[4]FIG. 4 NA-stop characteristics To provide a more detailed performance, Tables 2–5 list the RMS wavefront error across the field, distortion, Zernike coefficients, and variation in stop position with numerical aperture, respectively. The composite RMS of the system 100 of FIG. 2 is 2.90 mλ to 3.40 mλ across the field of view.

TABLE 2

RMS wavefront error and centroid shift across field of view for the system 100. The composite RMS wavefront is 2.90 mλ.

| Field Fract | DEG | Shift (x, y in nm) | Focus (mm) | RMS (waves) | Strehl |
| --- | --- | --- | --- | --- | --- |
| Y | 0.00 | 0.00 | 0.000000 | 0.000000 | 0.0021 | 1.0000 |
| Y | 0.35 | 1.06 | −0.000001 | 0.000000 | 0.0027 | 1.0000 |
| Y | 0.50 | 1.28 | 0.000000 | 0.000000 | 0.0023 | 1.0000 |
| Y | 0.71 | 1.20 | 0.000000 | 0.000000 | 0.0031 | 1.0000 |
| Y | 0.87 | 0.73 | 0.000000 | 0.000000 | 0.0031 | 1.0000 |
| Y | 0.94 | 0.39 | 0.000000 | 0.000000 | 0.0033 | 1.0000 |
| Y | 1.00 | 0.00 | 0.000000 | 0.000000 | 0.0034 | 1.0000 |

FIG. 3 is a representation of the chief ray distortion versus field of view for the present system 100. The chief ray distortion is corrected to less than 0.5 nm across the field at the wafer plane.

TABLE 3

Zernike coefficients in nm versus field of view for system 100 of FIG. 1

| | FIELD AT MASK (MM) | | | | | | |
| --- | --- | --- | --- | --- | --- | --- | --- |
| Term | 0 | −19.84 | −28.04 | −39.65 | −48.57 | −52.46 | −56.08 |
| 3 | 0.00 | 0.54 | 0.11 | 0.14 | 0.23 | −0.40 | 0.29 |
| 4 | −0.36 | 0.24 | −0.12 | −0.25 | 0.28 | 0.02 | −0.07 |
| 5 | 0.00 | 0.40 | 0.03 | −0.67 | 0.03 | 0.74 | −0.13 |
| 8 | 0.00 | −0.29 | −0.02 | 0.01 | −0.86 | −0.65 | 0.28 |
| 9 | −0.54 | −0.24 | 0.49 | 0.27 | −0.02 | −0.31 | −0.04 |
| 11 | 0.00 | −0.42 | 0.35 | 0.01 | 0.11 | −0.02 | 0.01 |
| 12 | 0.00 | 0.26 | 0.02 | 1.05 | 0.72 | 0.67 | −0.57 |
| 15 | 0.00 | 0.15 | 0.19 | 0.22 | −0.41 | −0.20 | −0.05 |
| 16 | 0.00 | −0.02 | −0.15 | −0.34 | −0.16 | −0.04 | 0.11 |
| 17 | −0.02 | 0.36 | 0.36 | −0.02 | 0.04 | −0.62 | −0.19 |
| 20 | 0.00 | 0.21 | 0.11 | 0.23 | 0.48 | 0.05 | −0.07 |
| 21 | 0.00 | −0.19 | −0.21 | −0.24 | −0.27 | 0.00 | 0.37 |
| 24 | 0.00 | −0.23 | −0.08 | 0.37 | 0.18 | −0.13 | −0.60 |
| 25 | 0.11 | 0.26 | 0.15 | −0.20 | −0.29 | −0.23 | −0.08 |
| 27 | 0.00 | 0.02 | 0.07 | −0.27 | −0.35 | −0.15 | −0.79 |
| 28 | −0.03 | 0.00 | 0.05 | 0.33 | 0.39 | 0.09 | −0.27 |
| 31 | 0.00 | 0.00 | −0.18 | −0.55 | −0.64 | −0.67 | −0.64 |
| 32 | 0.00 | −0.27 | −0.22 | 0.04 | 0.05 | 0.02 | −0.08 |
| 35 | 0.00 | −0.13 | 0.13 | 0.36 | 0.21 | 0.09 | −0.09 |
| 36 | −0.53 | −0.62 | −0.58 | −0.27 | 0.18 | 0.42 | 0.68 |
| 37 | −0.49 | −0.40 | −0.32 | −0.17 | −0.01 | 0.07 | 0.14 |

To go along with the good RMS values, the chief ray distortion is well corrected to less than 1 nm across the field of view. The centroid distortion, using the reference sphere set, is also corrected on the 1 nm level. Note that the choice of reference sphere has an impact on these values, and slight variations (~1 nm) will be observed if the reference sphere set if changed.

One skilled in the art can see from Table 2 that centroid correction methods were applied during the last optimization steps, so it is reasonable to expect a good set of Zernikes coefficients with such low RMS values. Table 3 demonstrates this fact and also shows that the low-order Zernikes were emphasized at the expense of the fifth-order and higher Zernike terms. These values are quite good considering the imagery is scan-averaged.

One of the advantages of the system 100 of FIG. 2 is the NA-stop position characteristics (stop deviation and stop shift). The stop shift vs. numerical aperture is computed using a macro set developed specially for the purpose of illustrating this advantage of the present system 100. The stop motion is computed for the design numerical aperture of 0.85 ($NA_{max}$) to a value of 0.50 (0.6×$NA_{max}$), a range that is required by a modern semiconductor process. To achieve this NA range, a stop motion of 26 mm is required.

FIG. 4 is a representation of a variation in stop position vs. numerical aperture (NA). While, the system 100 has a stop deviation of 34.5 mm, the actual stop shift vs. numerical aperture is much less due to the balance of higher order aberrations that affect the pupil imagery in the tangential plane. A polynomial fit to the stop motion yields a nearly perfect quadratic.

The stop deviation, also used as a performance metric, is approximated by the ratio of the effective chief ray height at the stop divided by the m-direction cosine at this plane or using Code V notations (y, r1, f7, ss)/(m r1 f7 ss)=33.15 mm. While there is a correlation between the stop deviation and stop shift (i.e., small stop deviation leads to a smaller stop shift), there are higher-order pupil aberrations that must be taken into account that influence this correlation.

The pupil imagery of the present 1½ waist system 100 is driven by the pupil imagery of the pair of lens groups G5/G6 and the strong net positive power of this pair creates a stop plane that suffers from undercorrected field curvature making the stop plane curve toward the wafer. This is balanced somewhat, by high-order overcorrect astigmatism, making rays from the tangential field actually focus closer to an ideal plane than rays from the sagittal field (see FIG. 5).

Figure 5:
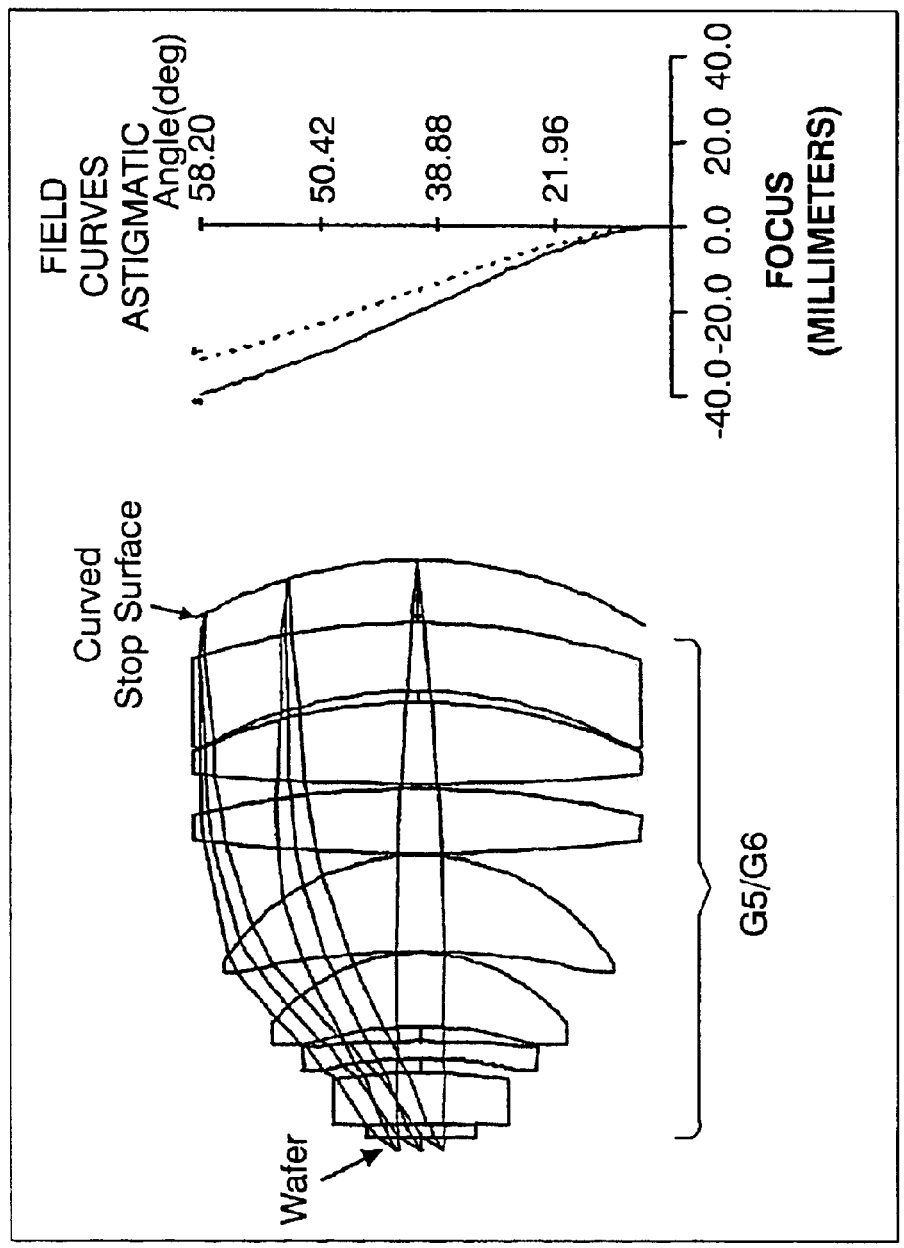
FIG. 5 is a representation showing pupil aberration of system of FIG. 2.

FIG. 5 is a representation showing that the pupil aberration of the system 100 can be visualized by interchanging the image plane and raytracing the design backwards to the stop plane. The tangential field is dominated by a large undercorrected component arising from the strong meniscus lens element E22 (which is the fourth element from the wafer 120 in FIG. 5).

The tangential field focus curve depicted in FIG. 5 can be fit to an even order polynomial and using knowledge of the third and fifth order Petzval contributions from the aft group closest to the wafer. From this fit, an estimate of the required balance between the undercorrected third order aberration change more slowly with changes in parameters, the fifth order tangential astigmatism and Petzval are essentially fixed by design choice (as in the third order Petzval contribution). The only practical free parameter then becomes the tangential third order astigmatism of the G5/G6 group. By parametrically studying the polynomial fit to the tangential field using different values of the third order astigmatism, one finds that this value needs to be on the order of about −0.450 mm to enable the overcorrected higher order components to artificially flatten the tangential field of the pupil image to acceptable levels (stop shift is about 20 mm).

Figure 6:
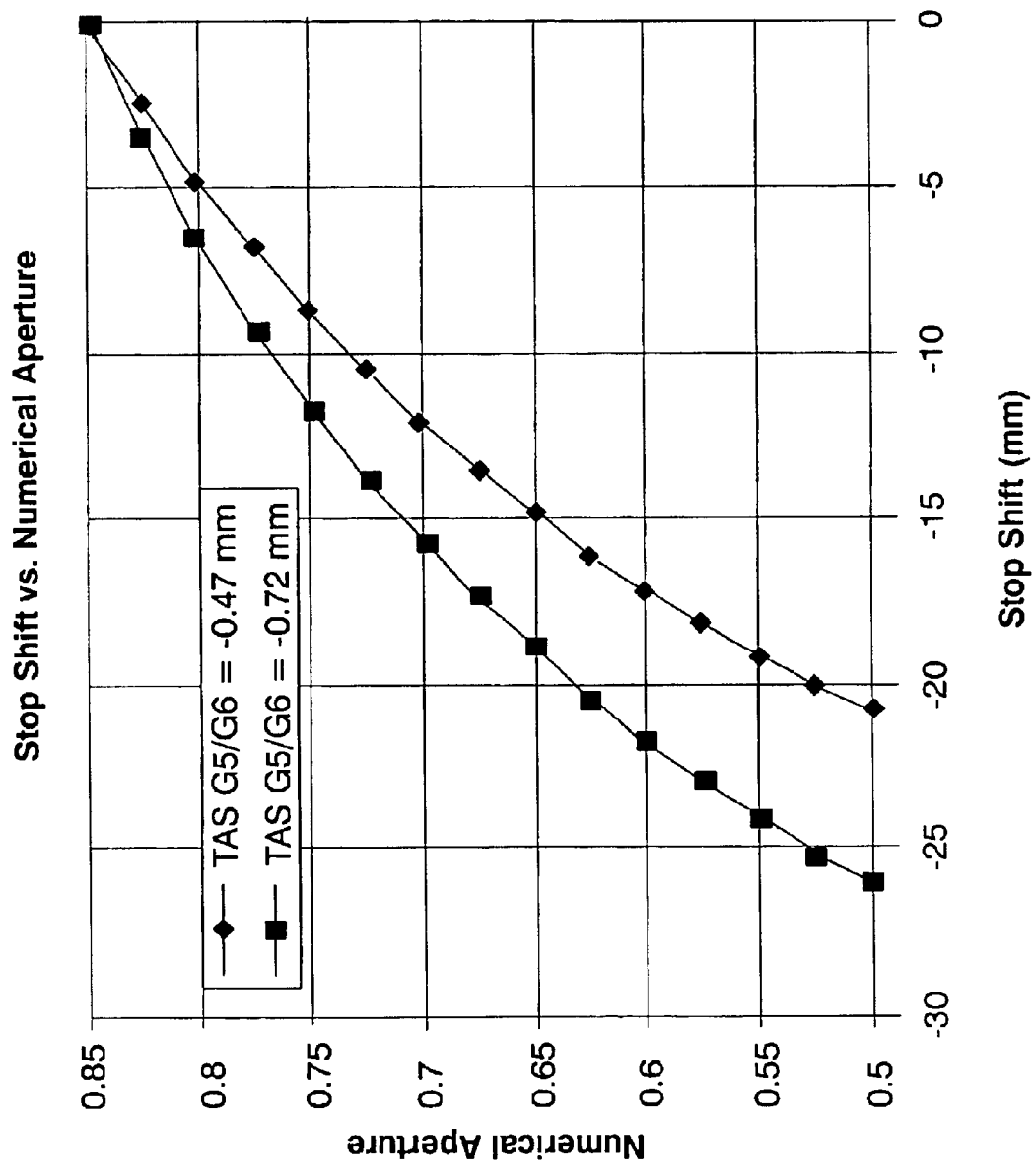
FIG. 6 shows a comparison of the stop shift in system of FIG. 2 with different values of tangential image astigmatism in groups G5/G6.

This methodology has been tested and the results are shown in FIG. 6. In the system 100, the third order tangential astigmatism of the image from the G5/G6 combination was −0.72 mm. A modification to the design was made so that the third order tangential astigmatism of the image from G5/G6 was reduced from −0.72 mm to −0.47 mm. Immediately, the stop deviation was reduced from 34.5 mm to 27.7 mm and the corresponding stop shift was reduced by nearly 6 mm. The design was able to accommodate what was essentially a redistribution of the third order astigmatism correction of the image rather easily, which is not surprising since the waists and bulges offer compensating astigmatism contributions (the overcorrected astigmatism from G1 is compensated by the undercorrected astigmatism from G2 and so forth). After this change, the fine balance between the low order and higher orders of astigmatism was lost. But the balance was established once again by shifting aspheres to more optimal locations.

Thus, FIG. 6 shows a comparison of the stop shift in the system 100 with different values of tangential image astigmatism in groups G5/G6. Reducing the third order tangential astigmatism of the image in this group lowers the third order tangential astigmatism of the pupil. This allows the overcorrected higher-order tangential field aberrations to artificially flatten the field, reducing the required stop-shift.

A decomposition of the aspheres is shown in Table 4 below. The character of these aspheres is similar to aspheres for which null lenses have been developed and proven. The high order aspheric components Z25, Z36, and Z49 are rather small, well controlled, and stable during optimization. Aspheres A2, A6, and A19 have striking similarities to other "good" and it is likely that little or no change to these aspheres would be required.

TABLE 4

| F1 | RScheitel | Rhuell | Def [mu] | Z4 | Z9 | Z16 | Z25 | Z36 | Z49 |
|---|---|---|---|---|---|---|---|---|---|
| 2 | 329.04 | 268.91 | 277.5 | 28.0 | 180.70 | −27.94 | 3.10 | −0.09 | 0.000 |
| 6 | 303.07 | 280.73 | 233.9 | −37.2 | 150.37 | 37.13 | −0.68 | 0.07 | 0.030 |
| 11 | −533.51 | −777.44 | 300.8 | 56.2 | 189.25 | −55.64 | 2.06 | −0.52 | 0.018 |
| 19 | 1562.06 | 2153.76 | 209.6 | −13.7 | −138.40 | 13.90 | −1.36 | −0.16 | 0.012 |
| 21 | −855.52 | −854.80 | 115.7 | −42.4 | 61.10 | 42.56 | 2.57 | −0.19 | −0.027 |
| 51 | −295.55 | −244.96 | 295.8 | −3.2 | −197.28 | 3.23 | 0.07 | 0.07 | 0.007 |

In Table 4, the asphere decomposition of system 100 demonstrates reasonably low higher-order component (Z25, Z36, and Z49). Additional work on A11, A21, and A51 can be performed to better balance the ratio of Z9/Z19 to the make the surfaces more testable in a direct manner using traditional null optics.

To improve the testability of this aspheres set, the ratio of Z9 to Z16 can be rebalanced on A11, A21, and A51 to better match the corresponding ratio of third to fifth order spherical aberration that can be generated in the design of null optics. Based on null lens design experience, the Z9/Z16 ratio would likely need to be increased on A11 (more Z9 or less Z19 or both). Good null lenses can be developed for a Z9/Z16=1, so this ratio needs to be decreased on A21 (the correct strategy is to reduce Z9 in this case). The converse is true on A51 since there simple is not enough Z16 and again the Z9/Z19 needs to be decreased. However and according to the present embodiment, the Z16 component is increased since this is relatively easy to do and in fact helps the design a bit in this location.

Now referring to FIG. 7 in which a dioptric projection lens system 200 according to another embodiment is illustrated. The projection lens system 200 is similar to the system 100 in that the system 100 is used as a starting point and three aspheres were added to key locations. The system 200 also has 25 optical elements and includes a reticle 210 and a wafer 220 on which a reduced image is formed based on the reticle 210. Beginning from the least image forward element and ending with the most image forward element along the optical path of the system 200, the system 200 includes a first lens element E1 (a positive lens); a second lens element E2 (a negative lens); a third lens element E3 (a negative lens); a fourth lens element E4 (a negative lens); a fifth lens element E5 (a negative lens); a sixth lens element E6 (a positive lens); a seventh lens element E7 (a positive lens); an eighth lens element E8 (a positive lens); a ninth lens element E9 (a positive lens); a tenth lens element E10 (a positive lens); an eleventh lens element E11 (a negative lens); a twelve lens element E12 (a negative lens); a thirteenth lens element E13 (a negative lens); a fourteenth lens element E14 (a negative lens); a fifteenth lens element E15 (a positive lens); a sixteenth lens element E16 (a positive lens); a seventeenth lens element E17 (a positive lens); an eighteenth lens element E18 (a positive lens); a nineteenth lens element E19 (a negative lens); a twentieth lens element E20 (a positive lens element); a twenty first lens element E21 (a positive lens); a twenty second lens element E22 (a positive lens); a twenty third lens element E23 (a positive lens); a twenty fourth lens element E24 (a negative lens); and a twenty fifth lens element E25 (a positive lens element).

The system 200 operates over a 28.04 mm field at a numerical aperture of about 0.92. The system 200 is one in which there is a first negative lens group consisting of a four negative lens subgroup preceded by a single positive lens (lens element E6). This is in direct contrast to the teachings in the patent literature (e.g., the '508 and '884 U.S. patents and U.S. Pat. No. 6,333,781) which teaches that the first lens group has positive refractive power.

Table 7 is a performance summary of the system 200 of FIG. 7 demonstrating scaling of the system 100 of FIG. 2 to NA 0.92 using additional aspheres.

TABLE 7

| Metric | Performance |
|---|---|
| Numerical aperture (wafer) | 0.92 |
| Field (wafer) | 28.04 |
| Reduction ratio (nominal) | 4:1 |
| Total track length (mm) | 1138.0 |
| Blank Mass | 125 kg |
| Forward working distance | 32.0 mm |
| Back working distance | 8.0 mm |
| Composite RMS wavefront error | 5.15λ |
| Chief ray distortion | <2.0 nm |
| (CHL) (paraxial value) | 420 nm/pm |
| (CVL) (paraxial value) | 18 nm/pm |

Table 8 is a corresponding asphere decomposition of system 200 design showing at all departures are less than 300 μm on good base radii.

TABLE 8

| F1 | RScheitel | Rhuell | Def [mu] | Z4 | Z9 | Z16 | Z25 | Z36 | Z49 |
|---|---|---|---|---|---|---|---|---|---|
| 2 | 650.41 | 436.35 | 299.9 | 36.5 | 193.89 | −36.56 | 3.56 | 0.02 | 0.006 |
| 6 | 2057.59 | 3344.13 | 36.5 | −29.3 | −1.23 | 29.76 | −5.01 | −0.50 | −0.032 |
| 11 | −498.27 | −683.91 | 291.9 | 57.6 | 174.96 | −58.45 | 13.82 | 0.87 | −0.100 |
| 12 | −860.34 | −1095.27 | 297.2 | −27.3 | 196.32 | 29.54 | −2.65 | −2.27 | −0.122 |
| 19 | −2350.53 | −1605.50 | 299.7 | 16.2 | −197.09 | −15.73 | −4.41 | −0.47 | −0.131 |
| 21 | −8741.23 | −3924.85 | 58.2 | −58.0 | 5.48 | 58.50 | −2.35 | −0.48 | 0.047 |
| 40 | 489.42 | 488.50 | 75.4 | −28.0 | 36.12 | 26.82 | 6.32 | 1.12 | 0.198 |
| 51 | −305.56 | −254.09 | 300.0 | −58.1 | −192.98 | 58.06 | 8.29 | 0.99 | −0.012 |
| 52 | 291.91 | 293.34 | 55.9 | 19.6 | −28.98 | −19.55 | −2.68 | −0.11 | 0.040 |

At NA 0.92, the design of the system 200 achieves a composite RMS wavefront error on the order of 5 ml with distortion corrected to less than 2 nm using 25 elements and 9 aspheres. An asphere was added next to the effort to stop to enable additional correction of spherical aberration. Both element E5 and E24 were asphereized to promote better correction of higher order astigmatism and oblique spherical aberration. Compared to the design of system 100, the design of system 200 needs to be relaxed somewhat by increasing the track length from 1100 mm to about 1140 mm, thus reducing incident ray angles. With this relaxation comes additional blank mass and a somewhat higher chromatic residual on axis (420 nm/pm). Both of these metrics can be improved by shifting power from G5 to G4.

A modest emphasis was placed on asphere control during this scaling of the system 100 up to the system 200 as shown in Table 8. All aspheres have departure less than 300 μm and lie atop surfaces whose radii are more than 300 mm. And most of the aspheres are beginning to show a reasonable balance between their low order and higher order to decomposition which confirms that acceptable aspheres can be incorporated into the design.

Applicants have discovered that an ArF dioptric projection lens system can be constructed that has features that are contrary to a number of the features that are taught in the patent literature and state of the art systems while not jeopardizing the performance of the system. More specifically, the present ArF dioptric projection lens system preferably incorporated one or more of the following features: (1) no aspheres are preferably used on convex surfaces of the first lens elements; (2) a Ca/Cb ratio of<1.60 is maintained on convex aspheres used on either E1 or E2; (3) a Ca/Cb ratio of<2.35 is maintained on convex aspheres used on either E3 or E4; (4) if convex aspheres are used, a Ca/Cb ratio of>0.70 is maintained if used on E1 or E2; (5) if convex aspheres are used, a Ca/Cb ratio of>0.45 is maintained if used on E3 or E4; (6) the design is constructed to ensure that there is no canceling relation between local powers of 2 aspheric surfaces in a region where the ratio of paraxial chief ray height to margin ray height absf (hb/ha) >0.35.

It is also possible to characterize the present systems in different terms and more specifically, the present systems can be defined in terms of other parameters. For example, a first parameter to describe each of the current systems is termed W and is constructed as the square root of the averaged and squared weighted refractive powers $w_j$ of the lens surface:

$$W = \left(\frac{1}{N}\sum_{j=1}^{j=N} w_j^2\right)^{\frac{1}{2}} \quad \text{Equation 1}$$

Where N is the number of surfaces and $w_j$ is the weighted refractive power of surface j, given by $$w_j = \frac{1}{1-mn'u'_N}\frac{y_j}{R_j}\frac{n'-n}{} \quad \text{Equation 2}$$

In this second equation, m is the magnification of the complete system, n and n are the indices of refraction before and after refraction at the surface j, R is the surface radius of curvature, y is the marginal paraxial ray height and $n'u'_N$ is the product of the index of refraction and marginal paraxial ray slope angle in image space.

If each of the lenses in an optical system contributes an equal amount of power, then $w_j$ is equal for each surface and the sum W is minimized. Lens systems with small W values use optical power efficiently at each surface, while lens systems with large W values have surfaces contributing optical power inefficiently. The advantage of using W as a performance metric is that it is independent of total track, aperture, and field diameter and $w_j$ and therefore, W is independent of scale, conjugate, aperture, or field, making it an extremely powerful tool by which to compare different optical systems.

The second parameter that is proposed is termed S and is constructed to measure the degree of symmetry to which the surfaces of the lens system are used. Specifically, the extent to which surfaces are concentric to the stop to satisfy the aplanatic condition. The term S is taken as the square root of the averaged and squared $s_j$:

$$S = \left(\frac{1}{N}\sum_{j=1}^{j=N} s_j^2\right) \quad \text{Equation (3)}$$

Where $s_j$ is given by $$s_j = \frac{1}{1-m}\frac{1}{m\bar{i}_{stop}(n'u'_N)}\bar{A}_j\Delta_{(\frac{u}{n})j} \quad \text{Equation (4)}$$

The term of $\bar{A}=n\bar{i}$ is the product of refraction and the chief ray angle of the incidence at surface at j; it measures when its surface is concentric to the stop or its images. The term $\Delta(u/n)=u'/n'-u/n$ is the condition for aplanatism of confocality. Both terms measure some symmetry in the way a surface refracts light. The angle $i_{stop}$ is the chief ray angle at the stop surface and it makes the ratio $\bar{A}/n\bar{i}_{stop}$ independent of the lens field of view. It will be understood that all quantities used are derived from paraxial marginal and chief ray traces and S does not measure the degree to which the lens is symmetric about its stop.

Using W and S as parameters or design characteristics, it is useful to compare to a typical well-established lens to develop a further understanding for these values. A Petzval objective is a distinctive lens style in which no significant beam bulges are created. A Petzval type lens exhibits a value for W that is smaller than S, typically W is around 0.4 and S is around 0.7. This is a statement that power is used effectively in the Petzval and that symmetry principles are absent from its design. Both these facts are understood in practice. The situation for a double Gauss objective is quite different in that these lenses exhibit a W value that is larger than S (e.g., typically, the W is around 1.0 and S is around 0.30). In lenses with a small S, the surfaces tend to be concave about the aperture stop. This is true in a double Gauss where symmetry is used to help correct the odd order aberrations in the design. The concentric meniscus surfaces about the stop also form a "mini-waist" in such a manner to help correct the Petzval sum at the inner surfaces of the meniscus lenses. The concentric construction also helps to minimize the tangential oblique spherical aberration of the off-axis bundles.

From these examples, one will appreciate that well designed hyper numerical aperture lithographic lenses to have both a low value of W ands a low value of S. The NA 0.85 design of system 100 exhibits this behavior with W=0.12 and S=0.25. The distribution of optical power ($w_j$) is illustrated in FIG. 8, while the degree of symmetry is depicted in FIG. 9. Based on examples of a number of suitable 1½ waist systems, the value for W typically ranges from about 0.11 to about 0.13, while the value for S ranges from about 0.19 to about 0.25.

The present projection systems are each constructed with a negative first lens group in a 1½ waist construction and these systems have been found suitable for step and scan lithography at ArF wavelengths. The design of the present systems differs from conventional design in that it teaches that the use of a negative first lens group, along with multiple aspheres (6), is capable of reducing blank mass by over 36 kg and a total track length by 100 to 150 nm over comparable systems that define the state of the art. At a NA of 0.85 over a 28.04 mm field, the field composite residual RMS wavefront error is on the order of 3 mλ with reasonable aspherics.

The pupil aberration of this 1½ waist system has been studied with an attempt to develop a meaningful method of rapidly controlling the pupil aberrations. With an understanding of the pupil aberration developed by the G5/G6 combination, a relatively simple constraint on the third order tangential image astigmatism from G5/G6 is shown to effectively reduce both the stop deviation and relative stop shift over the NA range. In view of the foregoing, it is desirable for keep the stop shift to about 20 mm over the NA range.

Accordingly and contrary to the teachings of the prior art, applicants have constructed a compact 1½ waist projection system with reduced axial chromatic aberration can be provided with a design where (1) the most object forward lens group is negative; (2) negative power is shifted from the principle waist at G3 to the secondary (½) waist at lens group G1; and (3) a complete removal of aspheres from the aft section of the projection lens group, especially in lens groups G4 and G5.

What is claimed is:

1. A projection lens having an object plane and an image plane and comprising objectwise to imagewise:
   a first lens group having negative refractive power;
   a second lens group having a positive refractive power;
   a third lens group having a negative refractive power;
   fourth, fifth and sixth lens groups having overall positive refractive power;
   the projection lens having a numerical aperture of at least about 0.85; and
   wherein the projection lens has a 1½ waist construction with a ½ waist being defined in the first lens group and a primary waist being defined in the third lens group.

2. The projection lens of claim 1, wherein each of the lens elements in the third lens group has a negative refractive power.

3. The projection lens of claim 1, wherein each of the lens elements in the fourth lens group has a positive refractive power.

4. The projection lens of claim 1, wherein the fifth lens group has at least five lens elements with at least four lens elements in the fifth lens group having positive refractive power.

5. The projection lens of claim 1, wherein a most object forward lens element of the first lens group has strong positive refractive power which in part defines the ½ waist in the first lens group.

6. The projection lens of claim 1, wherein the first lens group has more lens elements with negative refractive power than lens elements with positive refractive power.

7. The projection lens of claim 1, wherein a conjugate aperture stop is located between the fourth lens group and the fifth lens group.

8. The projection lens of claim 1, wherein the projection lens includes at least six aspheric surfaces.

9. The projection lens of claim 1, wherein the first six object forward lens elements are free of convex aspheric surfaces.

10. The projection lens of claim 1, wherein a diameter of each of the first five object forward lens elements is about equal to a diameter of the object.

11. The projection lens of claim 1, wherein a $C_a/C_b$ ratio of less than 1.60 is maintained on convex aspheric surfaces that are associated with either one of the two most object forward lens elements of the system.

12. The projection lens of claim 1, wherein a $C_a/C_b$ ratio of less than 2.35 is maintained on convex aspheric surfaces that are associated with either the third or fourth most object forward lens elements.

13. The projection lens of claim 1, wherein a first or second most object forward lens element has a concave aspheric surface and a $C_a/C_b$ ratio is maintained at greater than or equal to about 0.70.

14. The projection lens of claim 1, wherein a third or fourth most object forward lens elements has a concave aspheric surface and a $C_a/C_b$ ratio is maintained at greater than or equal to about 0.45.

15. The projection lens of claim 1, wherein negative refractive power is concentrated in a ½ waist formed in the first lens group and a primary waist formed in the third lens group.

16. The projection lens of claim 1, wherein the fourth and fifth lens groups are free of lens elements that have aspheric surfaces.

17. A projection lens having an object plane and an image plane and comprising objectwise to imagewise:
   a first lens group having negative refractive power;
   a second lens group having a positive refractive power;
   a third lens group having a negative refractive power;
   fourth, fifth and sixth lens groups having overall positive refractive power;
   the projection lens having a numerical aperture of at least about 0.85; and
   wherein the projection lens has a 1½ waist construction with a ½ waist being defined in the first lens group and a primary waist being defined in the third lens group, wherein the projection lens has a blank mass of about 94 kg and a CHL equal to about 400 nm/pm.

18. A projection lens having an object plane and an image plane and comprising objectwise to imagewise:
   a first lens group having negative refractive power;
   a second lens group having a positive refractive power;
   a third lens group having a negative refractive power;
   fourth, fifth and sixth lens groups having overall positive refractive power;
   the projection lens having a numerical aperture of at least about 0.85; and
   wherein the projection lens has a 1½ waist construction with a ½ waist being defined in the first lens group and a primary waist being defined in the third lens group, wherein the projection lens is characterized as having a W value of from about 0.11 to about 0.13 where W is equal to:

$$W = \left(\frac{1}{N}\sum_{j=1}^{j=N} w_j^2\right)^{\frac{1}{2}},$$

where N is the number of surfaces and $w_j$ is the weighted refractive power of surface J given by:

$$w_j = \frac{1}{1-m}\frac{y_j}{n'u'_N}\frac{n'-n}{R_j},$$

where, n and n are the indices of refraction before and after refraction at the surface j, R is the surface radius of curvature, y is the marginal paraxial ray height and $n'u'_N$ is the product of the index of refraction and marginal paraxial ray slope angle in image space.

19. A projection lens having an object plane and an image plane and comprising objectwise to imagewise:
   a first lens group having negative refractive power;
   a second lens group having a positive refractive power;
   a third lens group having a negative refractive power;
   fourth, fifth and sixth lens groups having overall positive refractive power;
   the projection lens having a numerical aperture of at least about 0.85; and
   wherein the projection lens has a 1½ waist construction with a ½ waist being defined in the first lens group and a primary waist being defined in the third lens group, wherein the projection lens is characterized as having an S value, which measures a degree of symmetry to which the surfaces of the lens system are used, of from about 0.19 to about 0.25 where S is equal to:

$$S = \left( \frac{1}{N} \sum_{j=1}^{j=N} s_j^2 \right),$$

where $S_j$ is given by:

$$s_j = \frac{1}{1-m} \frac{1}{m \bar{i}_{stop}(n'u'_N)} \bar{A}_j \Delta_{(\frac{u}{n})_j},$$

where the term $\bar{A} = n\bar{i}$ is the product of an index of refraction and a chief ray angle of an incidence at surface at j and the term $\Delta(u/n) = u'/n' - u'/n$ is the condition for aplanatism of confocality.

20. The projection lens of claim 1, wherein at least one lens element in the sixth lens group includes at least one aspheric surface.

21. The projection lens of claim 1, wherein the numerical aperture is at least about 0.92.

22. A projection lens having an object plane and an image plane and comprising objectwise to imagewise:
a first lens group having negative refractive power; and
at least three other lens groups having a positive refractive power and at least one other lens group having a negative refractive power, wherein the six most object forward lens elements are free of aspheric convex surfaces and the first lens group includes a ½ waist construction, while a primary waist is defined in the at least one other lens group.

23. The projection lens of claim 22, wherein the lens includes at least 25 lens elements and at least six aspheric surfaces.

24. The projection lens of claim 22, wherein the projection lens has a numerical aperture of at least about 0.85.

25. The projection lens of claim 22, wherein the at least one other lens group includes at least four lens elements that each has a negative refractive power.

26. The projection lens of claim 22, wherein the first lens group has at least three lens elements that each has a negative refractive power.

27. The projection lens of claim 22, wherein the projection lens includes at least 25 lens elements and at least nine aspheric surfaces.

28. The projection lens of claim 22, wherein a most object forward lens element has a strong positive refractive power.

29. A projection lens having an object plane and an image plane and comprising objectwise to imagewise:
a first lens group formed of at least four lens elements and having a negative refractive power and defining a (secondary) ½ waist of the projection lens;
an intermediate lens group having a negative refractive power and defining a primary waist of the projection lens; and
wherein the six most object forward lens elements are free of aspheric convex surfaces and wherein the two most image forward lens groups defined by at least 6 lens elements are free of aspheric surfaces.

30. A projection lens having an object plane and an image plane and comprising objectwise to imagewise:
a first lens group having negative refractive power;
a second lens group having a positive refractive power;
a third lens group having a negative refractive power;
fourth, fifth and sixth lens groups having overall positive refractive power; and
wherein the projection lens has a 1½ waist construction and wherein a ½ waist is defined in the first lens group and a primary waist is defined in the third lens group and is free of aspheric surfaces and wherein the fourth and fifth lens groups are free of aspheric surfaces.

31. The projection lens of claim 30, comprising a plurality of aspheric surfaces.

* * * * *